(12) United States Patent
Guo et al.

(10) Patent No.: US 12,500,597 B2
(45) Date of Patent: Dec. 16, 2025

(54) ANALOG-TO-DIGITAL CONVERSION METHOD, ANALOG-TO-DIGITAL CONVERTER, AND BASE STATION

(71) Applicant: SANECHIPS TECHNOLOGY CO., LTD., Guangdong (CN)

(72) Inventors: Anqiang Guo, Guangdong (CN); Shangzheng Yang, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 135 days.

(21) Appl. No.: 18/699,917

(22) PCT Filed: Mar. 28, 2022

(86) PCT No.: PCT/CN2022/083291
§ 371 (c)(1),
(2) Date: Apr. 10, 2024

(87) PCT Pub. No.: WO2023/065599
PCT Pub. Date: Apr. 27, 2023

(65) Prior Publication Data
US 2025/0240025 A1    Jul. 24, 2025

(30) Foreign Application Priority Data

Oct. 22, 2021    (CN) .......................... 202111233825.4

(51) Int. Cl.
*H03M 1/12*        (2006.01)
*H03M 1/06*        (2006.01)
*H03M 1/46*        (2006.01)

(52) U.S. Cl.
CPC ........... *H03M 1/123* (2013.01); *H03M 1/124* (2013.01); *H03M 1/06* (2013.01); *H03M 1/12* (2013.01); *H03M 1/46* (2013.01)

(58) Field of Classification Search
CPC ........ H03M 1/123; H03M 1/124; H03M 1/12; H03M 1/46; H03M 1/06
See application file for complete search history.

(56) References Cited

U.S. PATENT DOCUMENTS

2015/0009059 A1    1/2015  Chen et al.
2017/0077940 A1*   3/2017  Yoshioka ............ H03M 1/1245

OTHER PUBLICATIONS

Zhu, Yan, et al. "A 10-bit 500-MS/s Partial Interleaving Pipelined SAR ADS with Offset and Reference Mismatch Calibrations," IEEE Transactions On Very Large Scale Integration (VLSI) Systems, vol. 25, No. 1, Jan. 2017.

(Continued)

*Primary Examiner* — Joseph J Lauture
(74) *Attorney, Agent, or Firm* — Li & Cai Intellectual Property (USA) Office

(57) ABSTRACT

The present disclosure provides an analog-to-digital conversion method applied to an analog-to-digital converter and including: for any clock cycle, amplifying, through an inter-stage gain amplifier, a first residual stored in a sampling capacitor corresponding to a first analog-to-digital conversion channel, and sampling the amplified first residual through a stage-2 sub-analog-to-digital converter corresponding to the first analog-to-digital conversion channel; sampling and quantizing an analog signal through a stage-1 sub-analog-to-digital converter, and storing an obtained second residual in a sampling capacitor corresponding to a second analog-to-digital conversion channel; and generating a digital signal according to output signals of the stage-1 and stage-2 sub-analog-to-digital converters; and for any two adjacent clock cycles, an analog-to-digital conversion channel serving as the second analog-to-digital conversion channel in a current clock cycle serves as the first analog-to-digital conversion channel in a next clock cycle. The present (Continued)

disclosure further provides an analog-to-digital converter and a base station.

17 Claims, 5 Drawing Sheets

(56) References Cited

OTHER PUBLICATIONS

European Patent Office, the Extended European Search Report dated Aug. 1, 2025, for corresponding EP application No. 22882224.3.

\* cited by examiner

ANALOG-TO-DIGITAL CONVERSION METHOD, ANALOG-TO-DIGITAL CONVERTER, AND BASE STATION

CROSS-REFERENCE TO RELATED APPLICATIONS

The present disclosure is a National Phase Application filed under 35 U.S.C. 371 as a national stage of PCT/CN2022/083291, filed on Mar. 28, 2022, an application claiming the priority of Chinese Patent Application No. 202111233825.4 filed on Oct. 22, 2021, the contents of which are incorporated herein in their entirety by reference.

TECHNICAL FIELD

The present disclosure relates to the fields of electronic technology and communication technology, and in particular, to an analog-to-digital conversion method, an analog-to-digital converter (ADC), and a base station.

BACKGROUND

A high-precision high-speed ADC typically adopts a pipelined architecture, and a sub-ADC therein typically adopts a Successive Approximation Register (SAR) ADC architecture.

In some related techniques, however, the speed of the pipelined ADC is limited, and a requirement to the speed of the ADC cannot be met.

SUMMARY

Embodiments of the present disclosure provide an analog-to-digital conversion method, an analog-to-digital converter, and a base station.

In a first aspect, an embodiment of the present disclosure provides an analog-to-digital conversion method applied to an analog-to-digital converter, the analog-to-digital converter comprising a stage-1 sub-analog-to-digital converter, a plurality of sampling capacitors, an inter-stage gain amplifier, and a plurality of stage-2 sub-analog-to-digital converters: wherein the analog-to-digital converter comprises a plurality of analog-to-digital conversion channels each corresponding to one of the sampling capacitors and one of the stage-2 sub-analog-to-digital converters: the analog-to-digital conversion method comprises a plurality of clock cycles: for any of the clock cycles, the plurality of analog-to-digital conversion channels comprises an analog-to-digital conversion channel serving as a first analog-to-digital conversion channel and an analog-to-digital conversion channel serving as a second analog-to-digital conversion channel, and the analog-to-digital conversion method comprising:

amplifying, through the inter-stage gain amplifier, a first residual stored in a sampling capacitor corresponding to the first analog-to-digital conversion channel, and sampling the amplified first residual through a stage-2 sub-analog-to-digital converter corresponding to the first analog-to-digital conversion channel;

sampling and quantizing an analog signal through the stage-1 sub-analog-to-digital converter, and storing an obtained second residual in a sampling capacitor corresponding to the second analog-to-digital conversion channel; and generating a digital signal according to an output signal of the stage-1 sub-analog-to-digital converter and output signals of the plurality of stage-2 sub-analog-to-digital converters;

wherein, for any two adjacent clock cycles, the analog-to-digital conversion channel serving as the second analog-to-digital conversion channel in a current clock cycle serves as the first analog-to-digital conversion channel in a next clock cycle.

In a second aspect, an embodiment of the present disclosure provides an analog-to-digital converter, the analog-to-digital converter comprises a stage-1 sub-analog-to-digital converter, a plurality of sampling capacitors, an inter-stage gain amplifier, and a plurality of stage-2 sub-analog-to-digital converters: wherein the analog-to-digital converter comprises a plurality of analog-to-digital conversion channels each corresponding to one of the sampling capacitors and one of the stage-2 sub-analog-to-digital converters: the analog-to-digital converter comprises a plurality of clock cycles: for any of the clock cycles, the plurality of analog-to-digital conversion channels comprise an analog-to-digital conversion channel serving as a first analog-to-digital conversion channel and an analog-to-digital conversion channel serving as a second analog-to-digital conversion channel; and for any of the clock cycles:

the inter-stage gain amplifier is configured to amplify a first residual stored in a sampling capacitor corresponding to the first analog-to-digital conversion channel, and a stage-2 sub-analog-to-digital converter corresponding to the first analog-to-digital conversion channel is configured to sample the amplified first residual;

the stage-1 sub-analog-to-digital converter is configured to sample and quantize an analog signal, and store an obtained second residual in a sampling capacitor corresponding to the second analog-to-digital conversion channel;

the analog-to-digital converter further comprises an encoder configured to generate a digital signal according to an output signal of the stage-1 sub-analog-to-digital converter and output signals of the plurality of stage-2 sub-analog-to-digital converters;

wherein, for any two adjacent clock cycles, the analog-to-digital conversion channel serving as the second analog-to-digital conversion channel in the current clock cycle serves as the first analog-to-digital conversion channel in the next clock cycle.

In a third aspect, an embodiment of the present disclosure provides a base station, including the analog-to-digital converter described in the second aspect of the embodiments of the present disclosure.

In a fourth aspect, an embodiment of the present disclosure provides an analog-to-digital converter, comprising: a stage-1 sub-analog-to-digital converter: an inter-stage gain amplifier; a stage-2 sub-analog-to-digital converter: an encoder configured to generate a digital signal according to an output signal of the stage-1 sub-analog-to-digital converter and an output signal of the stage-2 sub-analog-to-digital converter; a first analog-to-digital conversion channel comprising a first stage-1 switch, a first stage-2 switch, and a first sampling capacitor, with the stage-1 sub-analog-to-digital converter connected to the first sampling capacitor through the first stage-1 switch, and the inter-stage gain amplifier connected to the first sampling capacitor through the first stage-2 switch; and a second analog-to-digital conversion channel comprising a second stage-1 switch, a second stage-2 switch, and a second sampling capacitor, with the stage-1 sub-analog-to-digital converter connected to the second sampling capacitor through the second stage-1 switch, and the inter-stage gain amplifier connected to the second sampling capacitor through the second stage-2 switch;

wherein the analog-to-digital converter is configured to perform an analog-to-digital conversion process that comprises a plurality of cyclic units repeated periodically, and each of the cyclic units comprises the following six stages that are performed in sequence: a first reset stage, in which the first stage-1 switch is ON, and the first stage-2 switch, the second stage-1 switch, and the second stage-2 switch are OFF; a first amplification stage, in which the first stage-1 switch and the second stage-2 switch are ON, and the first stage-2 switch and the second stage-1 switch are OFF; a first hold stage, in which the second stage-2 switch is ON, and the first stage-2 switch, the second stage-1 switch, and the first stage-1 switch are OFF; a second reset stage, in which the first stage-2 switch is ON, and the first stage-1 switch, the second stage-1 switch, and the second stage-2 switch are OFF; a second amplification stage, in which the first stage-2 switch and the second stage-1 switch are ON, and the first stage-1 switch and the second stage-2 switch are OFF; and a second hold stage, in which the second stage-1 switch is ON, and the first stage-1 switch, the first stage-2 switch, and the second stage-2 switch are OFF;

wherein, when the first stage-1 switch is ON, the stage-1 sub-analog-to-digital converter samples and quantizes an analog signal, and the first sampling capacitor samples a residual generated by quantization of the stage-1 sub-analog-to-digital converter: when the first stage-2 switch is ON, the stage-1 sub-analog-to-digital converter samples and quantizes an analog signal, and the second sampling capacitor samples a residual generated by quantization of the stage-1 sub-analog-to-digital converter: when the second stage-1 switch is ON, the inter-stage gain amplifier amplifies a residual held by the first sampling capacitor, and the stage-2 sub-analog-to-digital converter samples and quantizes the residual amplified by the inter-stage gain amplifier; when the second stage-2 switch is ON, the inter-stage gain amplifier amplifies a residual held by the second sampling capacitor, and the stage-2 sub-analog-to-digital converter samples and quantizes the residual amplified by the inter-stage gain amplifier; and when the second stage-1 switch and the second stage-2 switch are both OFF, the inter-stage gain amplifier is reset.

DETAIL DESCRIPTION OF EMBODIMENTS

Figure 1:
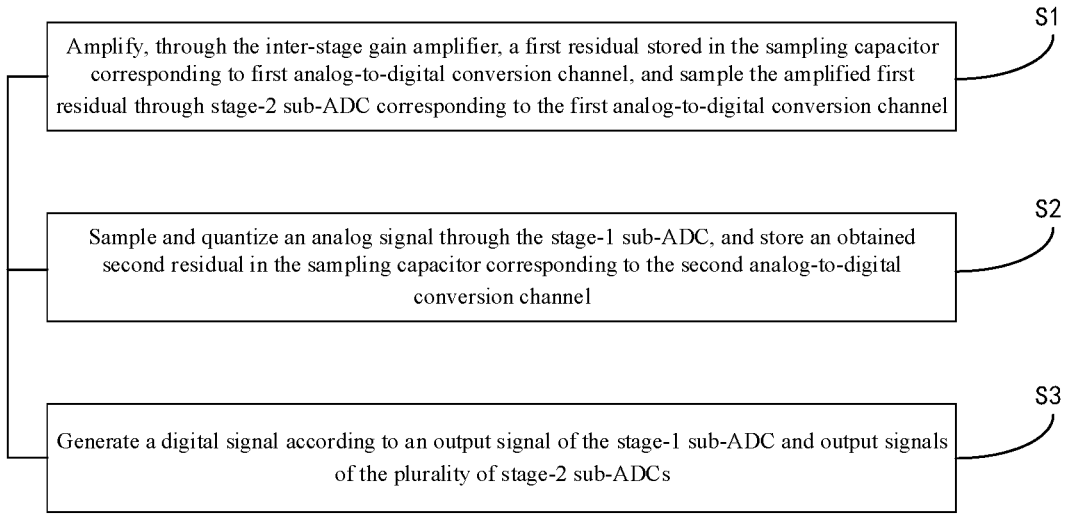
FIG. 1 is a flowchart of an analog-to-digital conversion method according to an embodiment of the present disclosure.

In order to enable those of ordinary skill in the art to better understand the technical solutions of the present disclosure, an analog-to-digital conversion method, an ADC, and a base station provided by the present disclosure are described in detail below with reference to the drawings.

Exemplary embodiments of the present disclosure will be described more fully below with reference to the drawings, but the exemplary embodiments described herein may be embodied in different forms and should not be interpreted as being limited to the embodiments described herein. Rather, the embodiments are provided to make the present disclosure thorough and complete, and may enable those of ordinary skill in the art to fully understand the scope of the present disclosure.

The embodiments described herein and the features therein can be combined with one another if no conflict is incurred.

The term "and/or" used herein includes any and all combinations of one or more associated listed items.

The terms used herein are merely used to describe specific embodiments, and are not intended to limit the present disclosure. As used herein, "a" and "an" which indicate a singular form are intended to include a plural form, unless expressly stated in the context. It should be further understood that the term(s) "include", "comprise" and/or "be made of" used herein indicate(s) the presence of the described features, integers, operations, elements and/or components, but do not exclude the presence or addition of one or more other features, integers, operations, elements, components and/or combinations thereof.

Unless otherwise defined, all terms (including technical and scientific terms) used herein have the same meaning as commonly understood by those of ordinary skill in the art. It should be further understood that terms, such as those defined in commonly used dictionaries, should be interpreted as having a meaning that is consistent with a meaning in the context of the related technology and the background of the present disclosure, and should not be interpreted in an idealized or overly formal sense unless expressly so defined herein.

It is found through researches by the inventors of the present disclosure that the factors limiting the speed of the pipelined ADC include the following ones.

(1) Limitation due to the total time of a sampling phase and an amplification phase of an inter-stage gain amplifier. The operation process of the inter-stage gain amplifier is divided into the sampling phase and the amplification phase. In the sampling phase, an input signal is sampled to a stage-1 sub-ADC, and is quantized in the stage-1 sub-ADC to obtain a residual (residual signal), and then the residual is stored in a sampling capacitor. In the amplification phase, the residual stored in the sampling capacitor is amplified by a fixed multiple by the inter-stage gain amplifier, and at the same time, the amplified residual is sampled to a stage-2 sub-ADC. The sampling and the quantization through the stage-1 sub-ADC to obtain the residual, the amplifying of the residual by the inter-stage gain amplifier, and the sampling of the amplified residual through the stage-2 sub-ADC all need to be completed within one clock cycle of the pipelined ADC. In some related techniques, the operation process in the sampling phase and the operation process in the amplification phase of the inter-stage gain amplifier are balanced by reducing the speed of the pipelined ADC.

(2) Limitation due to quantization time of the sub-ADC in the pipelined ADC. In the operation process of the stage-1 sub-ADC, the residual of the stage-1 sub-ADC can be obtained only when quantization of all digits of the stage-1 sub-ADC is completed. The function of the inter-stage gain amplifier is to effectively amplify the residual, and the amplification of the residual needs to occupy a specific amount of time. For the stage-2 sub-ADC, the inter-stage gain amplifier needs to wait for the stage-2 sub-ADC to complete quantization of all the digits thereof before sampling the amplified residual to the stage-2 sub-ADC effectively. Therefore, in one clock cycle, the inter-stage gain amplifier needs to wait for the stage-1 sub-ADC to complete the quantization before amplifying the residual, and also needs to wait for the stage-2 sub-ADC to complete the quantization before performing a next-stage sampling. Thus, the time of the residual amplification by the inter-stage gain amplifier is limited by the quantization time of the sub-ADC, which further limits the speed of the pipelined ADC.

Although the speed of the pipelined ADC can be increased to a certain extent by improving the processes, the cost is huge and the problem of the limitation to the speed of the pipelined ADC cannot be fundamentally solved.

In view of the above, in a first aspect, referring to FIG. 1, an embodiment of the present disclosure provides an analog-to-digital conversion method applied to an ADC. The ADC includes a stage-1 sub-ADC, a plurality of sampling capacitors, an inter-stage gain amplifier, and a plurality of stage-2 sub-ADCs; and the ADC includes a plurality of analog-to-digital conversion channels each corresponding to one of the sampling capacitors and one of the stage-2 sub-ADCs. The analog-to-digital conversion method includes a plurality of clock cycles; and for any one of the plurality of clock cycles, the plurality of analog-to-digital conversion channels include an analog-to-digital conversion channel serving as a first analog-to-digital conversion channel and the analog-to-digital conversion channel serving as a second analog-to-digital conversion channel, and the analog-to-digital conversion method includes the following operations S1 to S3.

At operation S1, amplifying, through the inter-stage gain amplifier, a first residual stored in the sampling capacitor corresponding to the first analog-to-digital conversion channel, and sampling the amplified first residual through the stage-2 sub-ADC corresponding to the first analog-to-digital conversion channel.

At operation S2, sampling and quantizing an analog signal through the stage-1 sub-ADC, and storing an obtained second residual in the sampling capacitor corresponding to the second analog-to-digital conversion channel.

At operation S3, generating a digital signal according to an output signal of the stage-1 sub-ADC and output signals of the plurality of stage-2 sub-ADCs.

For any two adjacent clock cycles, the analog-to-digital conversion channel serving as the second analog-to-digital conversion channel in the current clock cycle serves as the first analog-to-digital conversion channel in the next clock cycle.

The number of the analog-to-digital conversion channels is not particularly limited in the embodiment of the present disclosure. For example, the ADC may include two or more analog-to-digital conversion channels. The plurality of analog-to-digital conversion channels share the stage-1 sub-ADC and the inter-stage gain amplifier, which can avoid the mismatch problem occurring when the plurality of analog-to-digital conversion channels correspond to their respective stage-1 sub-ADCs and their respective inter-stage gain amplifiers.

In the embodiments of the present disclosure, the first analog-to-digital conversion channel corresponds to different analog-to-digital conversion channels in any two adjacent clock cycles, and the second analog-to-digital conversion channel corresponds to different analog-to-digital conversion channels in any two adjacent clock cycles. In any two adjacent clock cycles, the analog-to-digital conversion channel serving as the second analog-to-digital conversion channel in the current clock cycle serves as the first analog-to-digital conversion channel in the next clock cycle.

It should be noted that, the first analog-to-digital conversion channel in the current clock cycle and the second analog-to-digital conversion channel in the first clock cycle before the current clock cycle correspond to the same analog-to-digital conversion channel, and the first residual is obtained by sampling and quantizing an analog signal by the analog-to-digital conversion channel and storing in the sampling capacitor corresponding to the analog-to-digital conversion channel. The second analog-to-digital conversion channel in the current clock cycle and the first analog-to-digital conversion channel in the first clock cycle after the current clock cycle correspond to the same analog-to-digital conversion channel, and the second residual is amplified by the inter-stage gain amplifier in the first clock cycle after the current clock cycle.

In the embodiments of the present disclosure, for any one of the analog-to-digital conversion channels, the sampling phase and the amplification phase correspond to two adjacent clock cycles, the stage-1 sub-ADC can have a complete clock cycle for performing sampling and quantization, and the inter-stage gain amplifier can have a complete clock cycle for amplifying the residual, so that the limitation due to the total time of the sampling phase and the amplification phase can be alleviated, and the need to reduce the speed of the ADC for balancing the operation processes in the sampling phase and the amplification phase can be eliminated. For any one of the analog-to-digital conversion channels, the stage-1 sub-ADC completes the sampling and the quantization in the former clock cycle of the adjacent clock cycles, the inter-stage gain amplifier amplifies the residual in the latter clock cycle of the adjacent clock cycles; and in the same clock cycle, amplification of the residual is performed in the first analog-to-digital conversion channel while sampling and quantization of the stage-1 sub-ADC is performed in the second analog-to-digital conversion channel, thus periodical staggering of the sampling phase and the amplification phase is realized. Therefore, in a single clock cycle, the inter-stage gain amplifier does not need to wait for the stage-1 sub-ADC to complete the quantization, which facilitates increasing the speed of the ADC.

It should be further noted that, in the embodiments of the present disclosure, each analog-to-digital conversion channel corresponds one stage-2 sub-ADC; and when any analog-to-digital conversion channel amplifies the residual through the inter-stage gain amplifier, the amplified residual is sampled to the stage-2 sub-ADC corresponding to the analog-to-digital conversion channel. Therefore, the need to wait for the stage-2 sub-ADC to complete the quantization is eliminated, and the stage-2 sub-ADC has a complete clock cycle for sampling, thus realizing divided time-interleaving of the stage-2 sub-ADCs of a plurality of analog-to-digital conversion channels, and facilitating further increasing the speed of the ADC.

With the analog-to-digital conversion method provided in the embodiments of the present disclosure, the sampling phase and the amplification phase of the inter-stage gain amplifier are periodically staggered, and the plurality of stage-2 sub-ADCs are interleaved in time divisions, so that the stage-1 sub-ADC can have a complete clock cycle for performing sampling and quantization, the inter-stage gain amplifier can have a complete clock cycle for amplifying the residual, and the stage-2 sub-ADC can have a complete clock cycle for sampling, thereby alleviating the limitation due to the total time of the sampling phase and the amplification phase, eliminating the need to reduce the speed of the ADC for balancing the operation processes in the sampling phase and the amplification phase, balancing the operation process of the stage-1 sub-ADC and the operation process of the stage-2 sub-ADC, and facilitating increasing the speed of the ADC. In addition, while achieving the objective of a high speed of the ADC, the requirements of indexes of the inter-stage gain amplifier such as a gain bandwidth product and a slew rate can be reduced, the requirements of performance and power consumption of the inter-stage gain amplifier can be reduced, and manufacturing cost of the ADC can also be reduced; and with the plurality of analog-to-digital conversion channels sharing the stage-1 sub-ADC and the inter-stage gain amplifier, the mismatch problem can be avoided.

In some embodiments, the sampling process and the quantization process of the stage-2 sub-ADC are respectively completed in two clock cycles, and the plurality of analog-to-digital conversion channels share a comparator.

Figure 2:
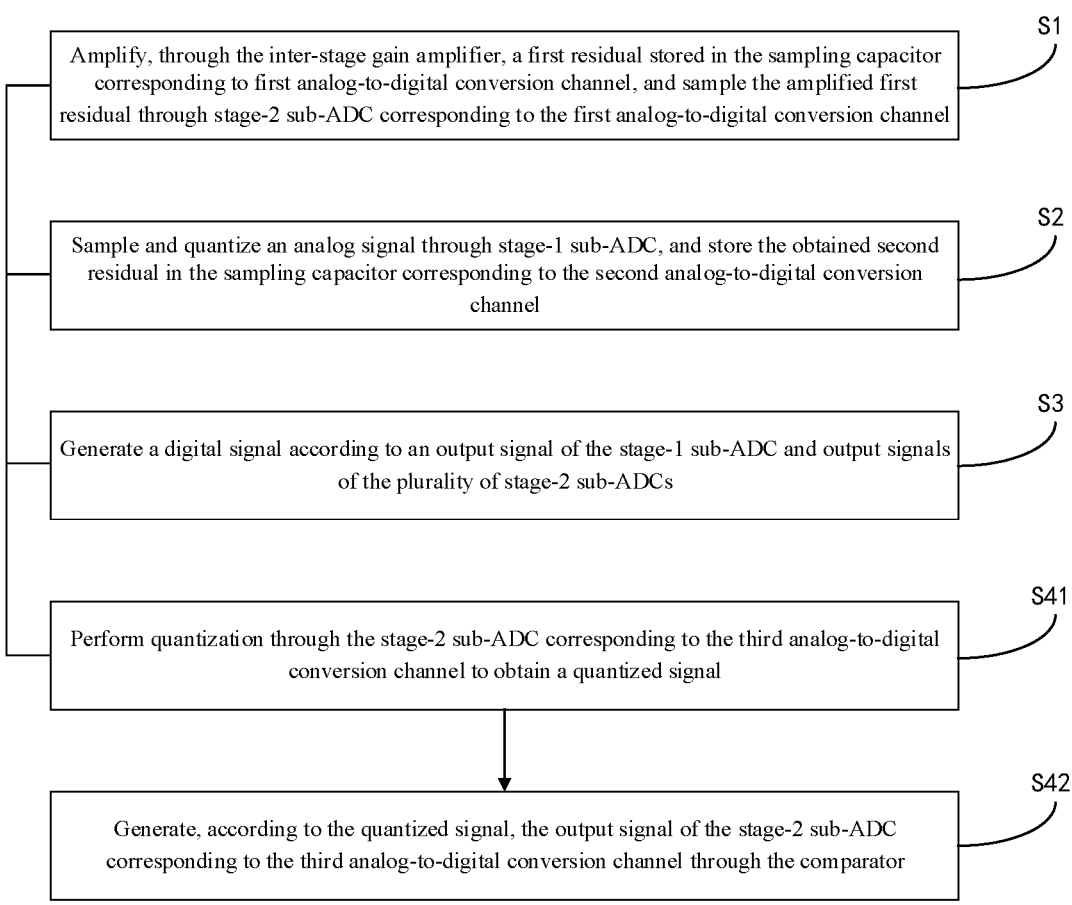
FIG. 2 is a flowchart of some operations in another analog-to-digital conversion method according to an embodiment of the present disclosure.

Correspondingly, in some embodiments, referring to FIG. 2, the ADC further includes a comparator; and for any clock cycle, the plurality of analog-to-digital conversion channels further include an analog-to-digital conversion channel serving as a third analog-to-digital conversion channel, and the analog-to-digital conversion method further includes the following operations S41 and S42.

At operation S41, performing quantization through the stage-2 sub-ADC corresponding to the third analog-to-digital conversion channel to obtain a quantized signal.

At operation S42, generating, according to the quantized signal, the output signal of the stage-2 sub-ADC corresponding to the third analog-to-digital conversion channel through the comparator.

The analog-to-digital conversion channel serving as the third analog-to-digital conversion channel serves as the first analog-to-digital conversion channel in the first clock cycle before the current clock cycle.

In the embodiments of the present disclosure, with the sampling process and the quantization process of the stage-2 sub-ADC respectively completed in two clock cycles, the stage-2 sub-ADC can have a complete clock cycle for performing the sampling and also can have a complete clock cycle for performing the quantization, which enables the inter-stage gain amplifier to amplify the residual without waiting for the stage-2 ADC to complete the quantization. With the plurality of analog-to-digital conversion channels sharing the comparator, the mismatch problem can be further avoided.

In the embodiments of the present disclosure, for any clock cycle, the third analog-to-digital conversion channel and the second analog-to-digital conversion channel may be the same analog-to-digital conversion channel or different analog-to-digital conversion channels. For example, in a case where the number of the analog-to-digital conversion channels is 2, the third analog-to-digital conversion channel and the second analog-to-digital conversion channel in any clock cycle may be the same analog-to-digital conversion channel; and in a case where the number of the analog-to-digital conversion channels is greater than 2, the third analog-to-digital conversion channel and the second analog-to-digital conversion channel in any clock cycle may be different analog-to-digital conversion channels.

Figure 3:
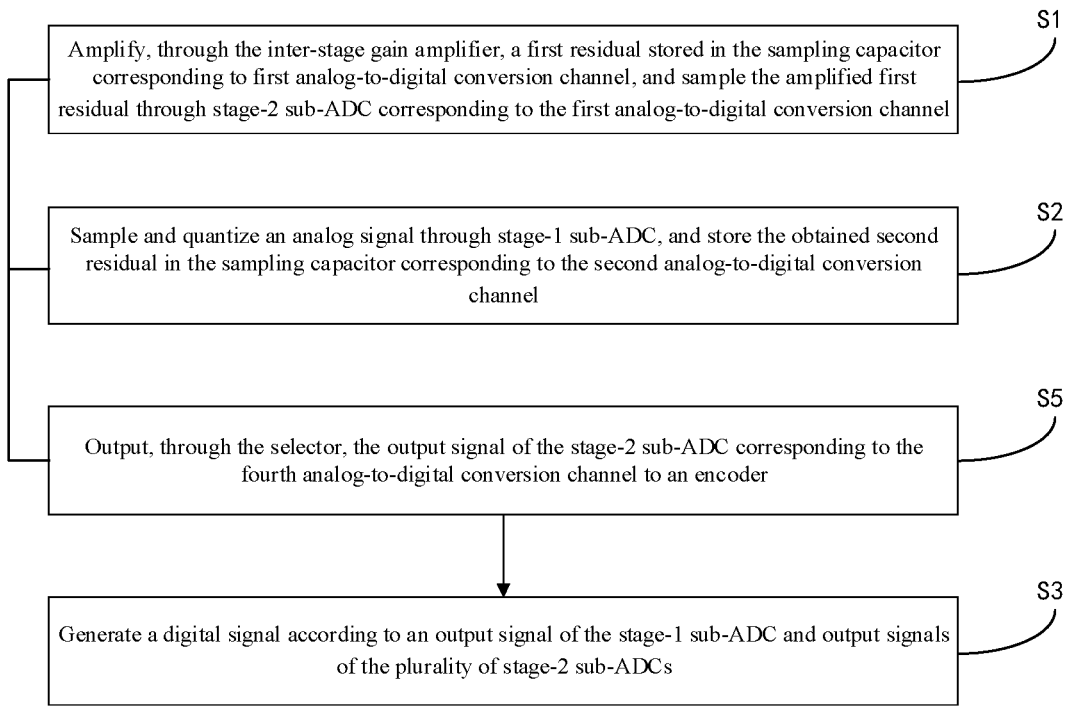
FIG. 3 is a flowchart of some operations in still another analog-to-digital conversion method according to an embodiment of the present disclosure.

In some embodiments, referring to FIG. 3, the ADC further includes a selector; and for any clock cycle, the plurality of analog-to-digital conversion channels further include an analog-to-digital conversion channel serving as a fourth analog-to-digital conversion channel, and the analog-to-digital conversion method further includes:

Operation S5, outputting, through the selector, the output signal of the stage-2 sub-ADC corresponding to the fourth analog-to-digital conversion channel to an encoder.

The analog-to-digital conversion channel serving as the fourth analog-to-digital conversion channel serves as the first analog-to-digital conversion channel in the second clock cycle before the current clock cycle.

In the embodiments of the present disclosure, for any clock cycle, the fourth analog-to-digital conversion channel and the first analog-to-digital conversion channel may be the same analog-to-digital conversion channel or different analog-to-digital conversion channels. For example, in a case where the number of the analog-to-digital conversion channels is 2 or 3, the fourth analog-to-digital conversion channel and the first analog-to-digital conversion channel in any clock cycle may be the same analog-to-digital conversion channel; and in a case where the number of the analog-to-digital conversion channels is greater than 3, the fourth analog-to-digital conversion channel and the second analog-to-digital conversion channel in any clock cycle may be different analog-to-digital conversion channels.

Figure 4:
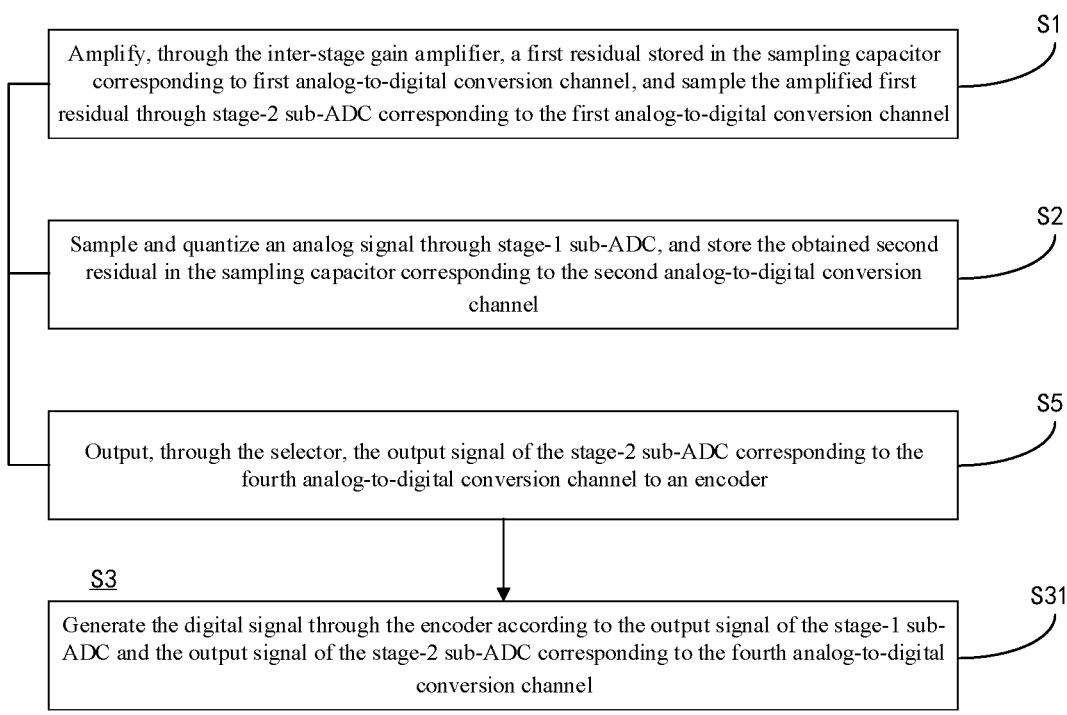
FIG. 4 is a flowchart of some operations in yet another analog-to-digital conversion method according to an embodiment of the present disclosure.

In some embodiments, referring to FIG. 4, the operation S3 includes:

Operation S31, generating the digital signal through the encoder according to the output signal of the stage-1 sub-ADC and the output signal of the stage-2 sub-ADC corresponding to the fourth analog-to-digital conversion channel.

In the embodiments of the present disclosure, periodical staggering and divided time-interleaving of the plurality of analog-to-digital conversion channels are carried out in different clock cycles.

Correspondingly, in some embodiments, the number of the plurality of analog-to-digital conversion channels is N; and for any clock cycle, the $n^{th}$ analog-to-digital conversion channel serves as the first analog-to-digital conversion channel, and the $m^{th}$ analog-to-digital conversion channel serves as the second analog-to-digital conversion channel; and wherein $$m = \begin{cases} (n+l) \bmod N, & n+l \neq N \\ N, & n+l = N \end{cases}$$

where mod represents a remainder operation, and N, l, n, and m are integers and satisfy $N>1$, $1 \leq n \leq N$, $1 \leq m \leq N$ and $1 \leq l < N$.

Figure 5:
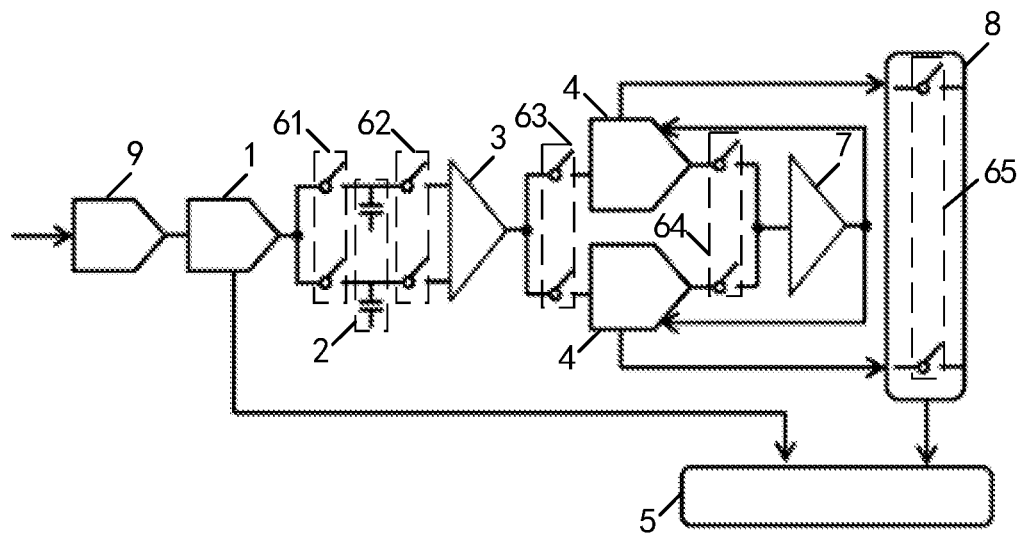
FIG. 5 is a schematic structural diagram of an ADC according to an embodiment of the present disclosure.

In a second aspect, referring to FIG. 5, an embodiment of the present disclosure provides an ADC, including: a stage-1 sub-ADC 1, a plurality of sampling capacitors 2, an inter-stage gain amplifier 3, and a plurality of stage-2 sub-ADCs 4; the ADC includes a plurality of analog-to-digital conversion channels each corresponding to one of the sampling capacitors 2 and one of the stage-2 sub-ADCs 4. The ADC includes a plurality of clock cycles. For any clock cycle, the plurality of analog-to-digital conversion channels include a analog-to-digital conversion channel serving as a first analog-to-digital conversion channel and a analog-to-digital conversion channel serving as a second analog-to-digital conversion channel; and for any clock cycle:

the inter-stage gain amplifier 3 is configured to amplify a first residual stored in the sampling capacitor 2 corresponding to the first analog-to-digital conversion channel, and the stage-2 sub-ADC 4 corresponding to the first analog-to-digital conversion channel is configured to sample the amplified first residual; and the stage-1 sub-ADC 1 is configured to sample and quantize an analog signal, and store an obtained second residual in the sampling capacitor 2 corresponding to the second analog-to-digital conversion channel.

The ADC further includes an encoder 5 configured to generate a digital signal according to an output signal of the stage-1 sub-ADC 1 and output signals of the plurality of stage-2 sub-ADCs 4.

For any two adjacent clock cycles, the analog-to-digital conversion channel serving as the second analog-to-digital conversion channel in the current clock cycle serves as the first analog-to-digital conversion channel in the next clock cycle.

The number of the analog-to-digital conversion channels is not particularly limited in the embodiment of the present disclosure. For example, the ADC may include two or more analog-to-digital conversion channels. The plurality of analog-to-digital conversion channels share the stage-1 sub-ADC and the inter-stage gain amplifier, which can avoid the mismatch problem occurring when the plurality of analog-to-digital conversion channels correspond to their respective stage-1 sub-ADCs and their respective inter-stage gain amplifiers.

In the embodiments of the present disclosure, the first analog-to-digital conversion channel corresponds to different analog-to-digital conversion channels in any two adjacent clock cycles, and the second analog-to-digital conversion channel corresponds to different analog-to-digital conversion channels in any two adjacent clock cycles. In any two adjacent clock cycles, the analog-to-digital conversion channel serving as the second analog-to-digital conversion channel in the current clock cycle serves as the first analog-to-digital conversion channel in the next clock cycle.

It should be noted that, the first analog-to-digital conversion channel in the current clock cycle and the second analog-to-digital conversion channel in the first clock cycle before the current clock cycle correspond to the same analog-to-digital conversion channel, and, the first residual is obtained by sampling and quantizing an analog signal through this analog-to-digital conversion channel, and then stored in the sampling capacitor corresponding to this analog-to-digital conversion channel. The second analog-to-digital conversion channel in the current clock cycle and the first analog-to-digital conversion channel in the first clock cycle after the current clock cycle correspond to the same analog-to-digital conversion channel, and the second residual will be amplified by the inter-stage gain amplifier in the first clock cycle after the current clock cycle.

In the embodiments of the present disclosure, for any one of the analog-to-digital conversion channels, the sampling phase and the amplification phase correspond to two adjacent clock cycles, the stage-1 sub-ADC can have a complete clock cycle for performing sampling and quantization, and the inter-stage gain amplifier can have a complete clock cycle for amplifying the residual, so that the limitation due to the total time of the sampling phase and the amplification phase can be alleviated, and the need to reduce the speed of the ADC for balancing the operation processes in the sampling phase and the amplification phase can be eliminated. For any one of the analog-to-digital conversion channels, the stage-1 sub-ADC completes the sampling and the quantization in the former clock cycle of the adjacent clock cycles, the inter-stage gain amplifier amplifies the residual in the latter clock cycle of the adjacent clock cycles; and in the same clock cycle, amplification of the residual is performed in the first analog-to-digital conversion channel while sampling and quantization of the stage-1 sub-ADC is performed in the second analog-to-digital conversion channel, thus periodical staggering of the sampling phase and the amplification phase is realized. Therefore, in a single clock cycle, the inter-stage gain amplifier does not need to wait for the stage-1 sub-ADC to complete the quantization, which facilitates increasing the speed of the ADC.

It should be further noted that, in the embodiments of the present disclosure, each analog-to-digital conversion channel corresponds one stage-2 sub-ADC; and when any analog-to-digital conversion channel amplifies the residual through the inter-stage gain amplifier, the amplified residual is sampled to the stage-2 sub-ADC corresponding to the analog-to-digital conversion channel. Therefore, the need to wait for the stage-2 sub-ADC to complete the quantization is eliminated, and the stage-2 sub-ADC has a complete clock cycle for sampling, thus realizing divided time-interleaving of the stage-2 sub-ADCs of a plurality of analog-to-digital conversion channels, and facilitating further increasing the speed of the ADC.

With the ADC provided in the embodiments of the present disclosure, the sampling phase and the amplification phase of the inter-stage gain amplifier are periodically staggered, and the plurality of stage-2 sub-ADCs are interleaved in time divisions, so that the stage-1 sub-ADC can have a complete clock cycle for performing sampling and quantization, the inter-stage gain amplifier can have a complete clock cycle for amplifying the residual, and the stage-2 sub-ADC can have a complete clock cycle for sampling, thereby alleviating the limitation due to the total time of the sampling phase and the amplification phase, eliminating the need to reduce the speed of the ADC for balancing the operation processes in the sampling phase and the amplification phase, balancing the operation process of the stage-1 sub-ADC and the operation process of the stage-2 sub-ADC, and facilitating increasing the speed of the ADC. In addition, while achieving the objective of a high speed of the ADC, the requirements of indexes of the inter-stage gain amplifier such as a gain bandwidth product and a slew rate can be reduced, the requirements of performance and power consumption of the inter-stage gain amplifier can be reduced, and manufacturing cost of the ADC can also be reduced; and with the plurality of analog-to-digital conversion channels sharing the stage-1 sub-ADC and the inter-stage gain amplifier, the mismatch problem can be avoided.

In some embodiments, referring to FIG. 5, for any analog-to-digital conversion channel, the analog-to-digital conversion channel includes a stage-1 switch 61, a stage-2 switch 62, and a stage-3 switch 63. The stage-1 sub-ADC 1 is connected to the sampling capacitor 2 corresponding to the analog-to-digital conversion channel through the stage-1 switch 61, and the inter-stage gain amplifier 3 is connected to the sampling capacitor 2 corresponding to the analog-to-digital conversion channel through the stage-2 switch 62, and is connected to the stage-2 sub-ADC 4 corresponding to the analog-to-digital conversion channel through the stage-3 switch 63; and for any clock cycle:

the stage-1 switch 61 of the first analog-to-digital conversion channel is OFF, and the stage-2 switch 62 and the stage-3 switch 63 of the first analog-to-digital conversion channel are ON, so that the inter-stage gain amplifier 3 amplifies the first residual stored in the sampling capacitor 2 corresponding to the first analog-to-digital conversion channel, and the amplified first residual is sampled through the stage-2 sub-ADC 4 corresponding to the first analog-to-digital conversion channel; and the stage-1 switch 61 of the second analog-to-digital conversion channel is ON, and the stage-2 switch 62 and the stage-3 switch 63 of the second analog-to-digital conversion channel are OFF, so that the stage-1 sub-ADC 1 samples and quantizes the analog signal, and stores the obtained second residual in the sampling capacitor 2 corresponding to the second analog-to-digital conversion channel.

In some embodiments, any clock cycle includes a reset stage, an amplification stage, and a hold stage in sequence.

In the reset stage, the stage-1 switch 61 and the stage-2 switch 62 of the first analog-to-digital conversion channel are OFF, and the inter-stage gain amplifier 3 is reset: the stage-1 switch 61 of the second analog-to-digital conversion channel is ON, the stage-2 switch 62 of the second analog-to-digital conversion channel is OFF, and the stage-1 sub-ADC 1 samples and quantizes the analog signal.

In the amplification stage, the stage-1 switch 61 of the first analog-to-digital conversion channel is OFF, the stage-2 switch 62 of the first analog-to-digital conversion channel is ON, and the inter-stage gain amplifier 3 amplifies the first residual: the stage-1 switch 61 of the second analog-to-digital conversion channel is ON, the stage-2 switch 62 of the second analog-to-digital conversion channel is OFF, and the stage-1 sub-ADC 1 samples and quantizes the analog signal.

In the hold stage, the stage-1 switch 61 of the first analog-to-digital conversion channel is OFF, the stage-2 switch 62 of the first analog-to-digital conversion channel is ON, and the inter-stage gain amplifier 3 amplifies the first residual: the stage-1 switch 61 and the stage-2 switch 62 of the second analog-to-digital conversion channel are OFF, and the second residual is held in the sampling capacitor 2 corresponding to the second analog-to-digital conversion channel.

In some embodiments, the sampling process and the quantization process of the stage-2 sub-ADC are respectively completed in two clock cycles, and the plurality of analog-to-digital conversion channels share a comparator.

Correspondingly, in some embodiments, referring to FIG. 5, the ADC further includes a comparator 7. For any clock cycle, the plurality of analog-to-digital conversion channels further include an analog-to-digital conversion channel serving as a third analog-to-digital conversion channel. For any clock cycle: the stage-2 sub-ADC corresponding to the third analog-to-digital conversion channel performs quantization to obtain a quantized signal: the comparator 7 is configured to generate the output signal of the stage-2 sub-ADC 4 corresponding to the third analog-to-digital conversion channel according to the quantized signal; and the analog-to-digital conversion channel currently serving as the third analog-to-digital conversion channel serves as the first analog-to-digital conversion channel in the first clock cycle before the current clock cycle.

In the embodiments of the present disclosure, with the sampling process and the quantization process of the stage-2 sub-ADC respectively completed in two clock cycles, the stage-2 sub-ADC can have a complete clock cycle for performing the sampling and also can have a complete clock cycle for performing the quantization, which enables the inter-stage gain amplifier to amplify the residual without waiting for the stage-2 ADC to complete the quantization. With the plurality of analog-to-digital conversion channels sharing the comparator, the mismatch problem can be further avoided.

In the embodiments of the present disclosure, for any clock cycle, the third analog-to-digital conversion channel and the second analog-to-digital conversion channel may be the same analog-to-digital conversion channel or different analog-to-digital conversion channels. For example, in a case where the number of the analog-to-digital conversion channels is 2, the third analog-to-digital conversion channel and the second analog-to-digital conversion channel in any clock cycle may be the same analog-to-digital conversion channel; and in a case where the number of the analog-to-digital conversion channels is greater than 2, the third analog-to-digital conversion channel and the second analog-to-digital conversion channel in any clock cycle may be different analog-to-digital conversion channels.

In some embodiments, referring to FIG. 5, for any analog-to-digital conversion channel, the analog-to-digital conversion channel includes a stage-4 switch 64, and the stage-2 sub-ADC 4 corresponding to the analog-to-digital conversion channel is connected to the comparator 7 through the stage-4 switch 64.

For any clock cycle: the stage-4 switch 64 of the third analog-to-digital conversion channel is ON, so as to enable the stage-2 sub-ADC 4 corresponding to the third analog-to-digital conversion channel to perform quantization to obtain the quantized signal, and enable the comparator 7 to generate the output signal of the stage-2 sub-ADC corresponding to the third analog-to-digital conversion channel according to the quantized signal.

In some embodiments, referring to FIG. 5, the ADC further includes a selector 8; for any clock cycle, the plurality of analog-to-digital conversion channels further include an analog-to-digital conversion channel serving as a fourth analog-to-digital conversion channel; for any clock cycle: the selector 8 is configured to output the output signal of the stage-2 sub-ADC 4 corresponding to the fourth analog-to-digital conversion channel to the encoder 5; and the analog-to-digital conversion channel serving as the fourth analog-to-digital conversion channel serves as the first analog-to-digital conversion channel in the second clock cycle before the current clock cycle.

In the embodiments of the present disclosure, for any clock cycle, the fourth analog-to-digital conversion channel and the first analog-to-digital conversion channel may be the same analog-to-digital conversion channel or different analog-to-digital conversion channels. For example, in a case where the number of the analog-to-digital conversion channels is 2 or 3, the fourth analog-to-digital conversion channel and the first analog-to-digital conversion channel in any clock cycle may be the same analog-to-digital conversion channel; and in a case where the number of the analog-to-digital conversion channels is greater than 3, the fourth analog-to-digital conversion channel and the second analog-to-digital conversion channel in any clock cycle may be different analog-to-digital conversion channels.

In some embodiments, the selector 8 includes a plurality of stage-5 switches 65 in one-to-one correspondence with the plurality of analog-to-digital conversion channels; for any analog-to-digital conversion channel, the stage-2 sub-ADC 4 corresponding to the analog-to-digital conversion channel is connected to the encoder 5 through the corresponding stage-5 switch 65; and for any clock cycle: the stage-5 switch 65 corresponding to the fourth analog-to-digital conversion channel is ON, so as to output the output signal of the stage-2 sub-ADC 4 corresponding to the fourth analog-to-digital conversion channel to the encoder 5.

In some embodiments, the encoder 5 is configured to generate the digital signal according to the output signal of the stage-1 sub-ADC 1 and the output signal of the stage-2 sub-ADC 4 corresponding to the fourth analog-to-digital conversion channel.

In the embodiments of the present disclosure, periodical staggering and divided time-interleaving of the plurality of analog-to-digital conversion channels are carried out in different clock cycles.

In some embodiments, the number of the plurality of analog-to-digital conversion channels is N; and for any clock cycle, an $n^{th}$ analog-to-digital conversion channel serves as the first analog-to-digital conversion channel, and an $m^{th}$ analog-to-digital conversion channel serves as the second analog-to-digital conversion channel; and $$m = \begin{cases} (n+l) \bmod N, & n+l \neq N \\ N, & n+l = N \end{cases}$$

where mod represents a remainder operation, and N, l, n, and m are integers and satisfy N>1, 1≤n≤N, 1≤m≤N, and 1≤l<N.

In some embodiments, referring to FIG. 5, the ADC further includes an input buffer 9 configured to cache the analog signal.

Figure 6:
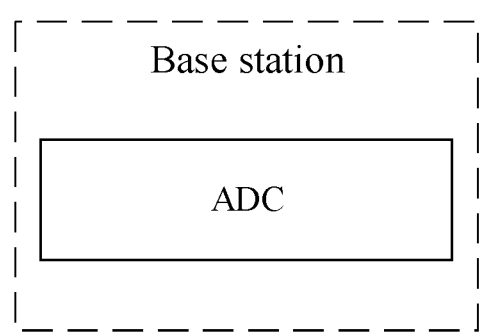
FIG. 6 is a block diagram of a base station according to an embodiment of the present disclosure.

In a third aspect, referring to FIG. 6, an embodiment of the present disclosure provides a base station, including the ADC provided in the second aspect of the embodiments of the present disclosure.

In order to enable those of ordinary skill in the art to understand the technical solutions provided in the embodiments of the present disclosure more clearly, the technical solutions provided in the embodiments of the present disclosure are illustrated in detail below by specific Embodiment One to Embodiment Four.

Example One

Figure 7:
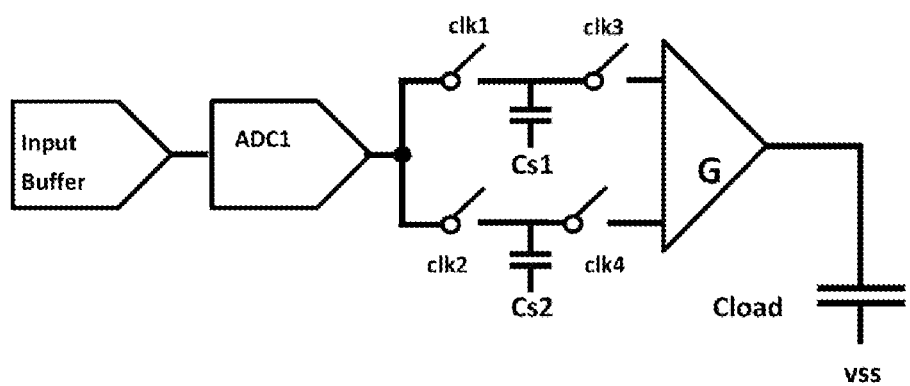
FIG. 7 is a schematic structural diagram of another ADC according to an embodiment of the present disclosure.

In this example, by taking the ADC having two analog-to-digital conversion channels as an example, the periodical staggering of the sampling phase and the amplification phase of the inter-stage gain amplifier is described. The structure of the ADC in this example is shown in FIG. 7, the ADC includes the input buffer, the stage-1 sub-ADC ADC1, the sampling capacitor Cs1, the sampling capacitor Cs2, the stage-1 switch clk1, the stage-1 switch clk2, the stage-2 switch clk3, the stage-2 switch clk4, the inter-stage gain amplifier G, and the stage-2 sub-ADCs, wherein the stage-2 sub-ADCs are simplified as a capacitive load Cload. In this example, the sampling capacitor Cs1, the stage-1 switch clk1, and the stage-2 switch clk3 correspond to one analog-to-digital conversion channel; and the sampling capacitor Cs2, the stage-1 switch clk2, and the stage-2 switch clk4 correspond to the other analog-to-digital conversion channel.

Figure 8:
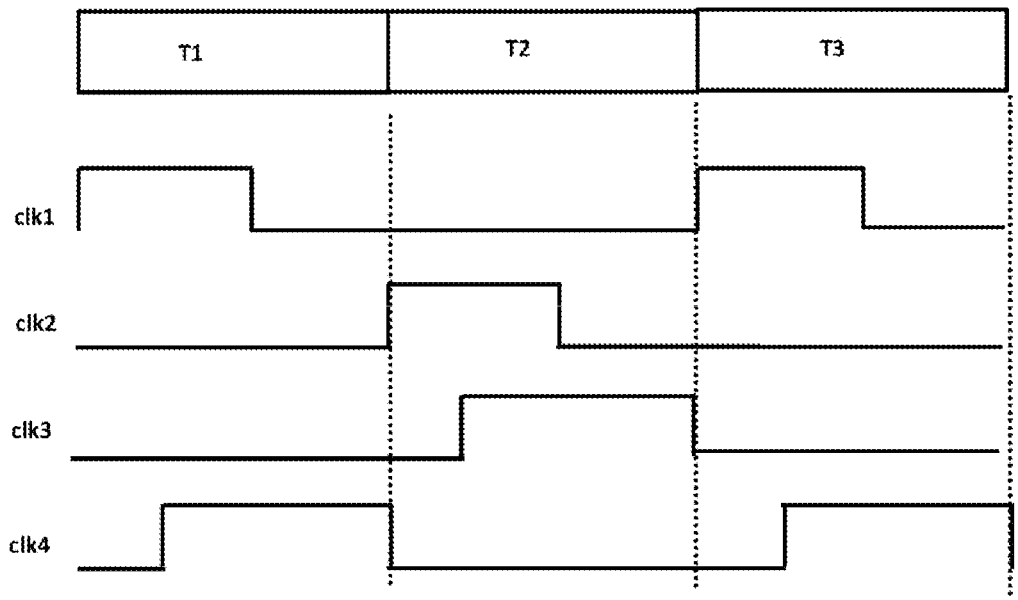
FIG. 8 is a timing diagram of the ADC shown in FIG. 7.

FIG. 8 is a timing diagram of the ADC shown in FIG. 7, with T1, T2 and T3 being three adjacent clock cycles. As shown in FIG. 8, the stage-1 switch clk1 and the stage-1 switch clk2 are respectively turned on in adjacent clock cycles, the stage-1 switch clk1 and the stage-2 switch clk3 are respectively turned on in adjacent cycles, the stage-1 switch clk2 and the stage-2 switch clk4 are respectively turned on in adjacent cycles, the stage-1 switch clk1 and the stage-2 switch clk4 are both ON for some time, and the stage-1 switch clk2 and the stage-2 switch clk3 are both ON for some time. Thus, the periodical staggering of the sampling phase and the amplification phase of the inter-stage gain amplifier is realized.

Reference may be made to the following Example Two for a specific description of the above time sequences of this example. It should be noted that, when the stage-1 switch clk1 or clk2 is ON, the stage-1 sub-ADC ADC1 samples and quantizes the analog signal, and the corresponding sampling capacitor Cs1 or Cs2 samples the residual obtained by the quantization of the stage-1 sub-ADC ADC1; and when the stage-2 switch clk3 or clk4 is ON, the inter-stage gain amplifier G amplifies the residual held by the corresponding sampling capacitor Cs1 or Cs2, and the stage-2 sub-ADC samples and quantizes the residual amplified by the inter-stage gain amplifier G. When the stage-2 switch clk3 and the stage-2 switch clk4 are both OFF, the inter-stage gain amplifier G is reset.

Example Two

Figure 9:
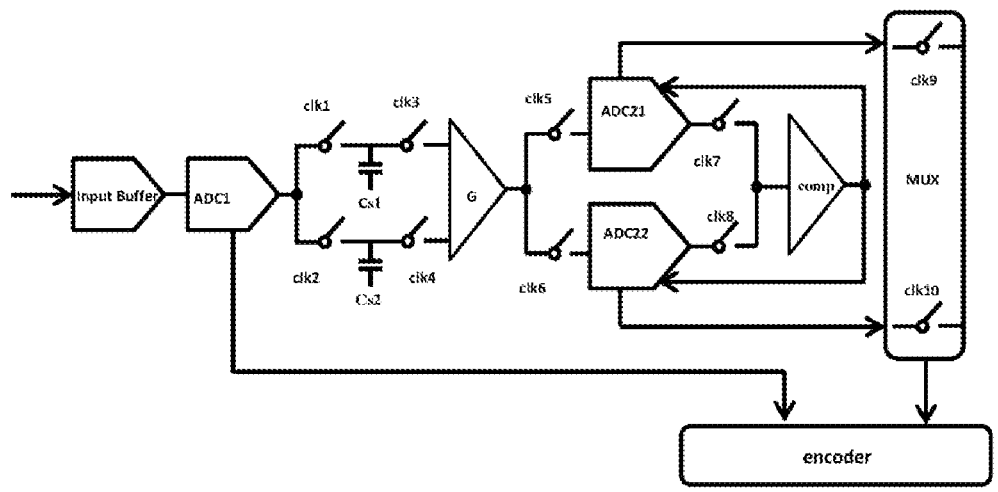
FIG. 9 is a schematic structural diagram of still another ADC according to an embodiment of the present disclosure.

The ADC having two analog-to-digital conversion channels is taken as an example in this example for explanation. The structure of the ADC in this example is shown in FIG. 9, and the ADC includes the input buffer, the stage-1 sub-ADC ADC1, the sampling capacitor Cs1, the sampling capacitor Cs2, the inter-stage gain amplifier G, the stage-2 sub-ADCs ADC21, ADC22, the comparator comp, the selector MUX, the stage-1 switches clk1, clk2, the stage-2 switches clk3, clk4, the stage-3 switches clk5, clk6, the stage-4 switches clk7, clk8, the stage-5 switches clk9, clk10, and the encoder. In this example, the sampling capacitor Cs1, the stage-1 switch clk1, the stage-2 switch clk3, the stage-2 sub-ADC ADC21, the stage-3 switch clk5, the stage-4 switch clk7, and the stage-5 switch clk9 correspond to one analog-to-digital conversion channel; and the sampling capacitor Cs2, the stage-1 switch clk2, the stage-2 switch clk4, the stage-2 sub-ADC ADC22, the stage-3 switch clk6, the stage-4 switch clk8, and the stage-5 switch clk10 correspond to the other analog-to-digital conversion channel.

Figure 10:
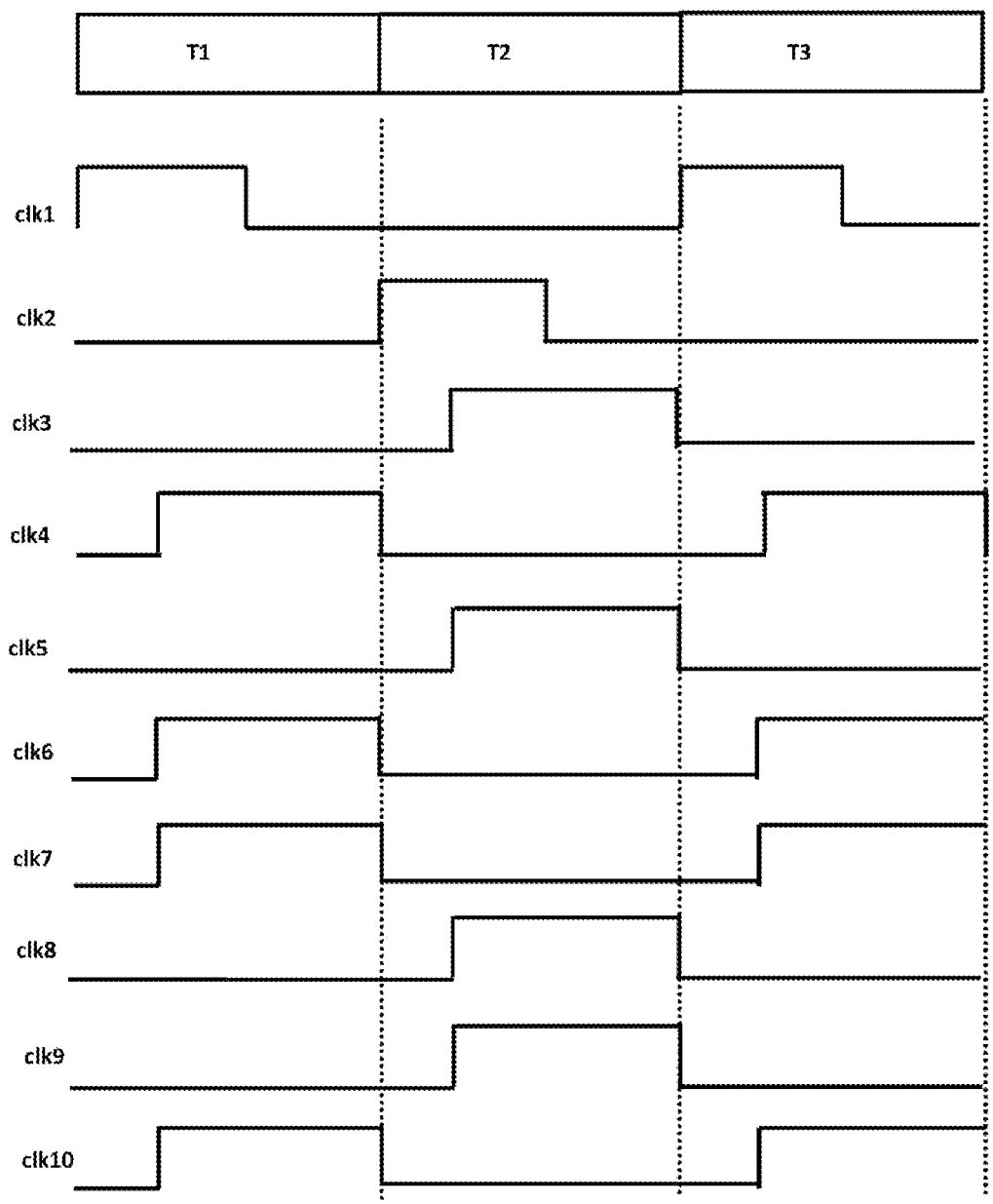
FIG. 10 is a timing diagram of the ADC shown in FIG. 9.

FIG. 10 is a timing diagram of the ADC shown in FIG. 9, with T1, T2, and T3 being three adjacent clock cycles. Every two adjacent clock cycles are taken as one cyclic unit that is repeated periodically. For example, by taking the clock cycles T1 and T2 in FIG. 10 as one cyclic unit, the cycle unit is divided into the following six stages.

In the first stage (a reset stage, starting from the beginning of the clock cycle T1 in FIG. 10), the switch clk1 is ON, the switches clk2, clk3, clk4 are OFF, the stage-1 sub-ADC ADC1 and the sampling capacitor Cs1 perform signal sampling at the same time, the inter-stage gain amplifier G is reset, and the switches clk6, clk8, clk5, clk7 are OFF.

In the second stage (an amplification stage), the switches clk1, clk4 are ON, the switches clk2, clk3 are OFF, the stage-1 sub-ADC ADC1 and the sampling capacitor Cs1 complete signal holding at the same time, the stage-1 sub-ADC ADC1 performs quantization during the signal holding, the switches clk6, clk7 are ON, the switches clk5, clk8 are OFF, and the residual is amplified by the inter-stage gain amplifier G, and is sampled to the stage-2 sub-ADC ADC22 to be quantized.

In the third stage (a hold stage), the switch clk4 is ON, the switches clk2, clk3, clk1 are OFF, the stage-1 sub-ADC ADC1 completes the quantization and is disconnected from the sampling capacitor Cs1, the residual of the stage-1 sub-ADC ADC1 is held on the sampling capacitor Cs1, the switches clk6, clk7 are ON, the switches clk5, clk8 are OFF, and the residual is still amplified by the inter-stage gain amplifier G, and is sampled to the stage-2 sub-ADC ADC22 to be quantized.

In the fourth stage (a reset stage, starting from the beginning of the clock cycle T2 in FIG. 10), the switch clk2 is ON, the switches clk1, clk3, clk4 are OFF, the stage-1 sub-ADC ADC1 and the sampling capacitor Cs2 perform signal sampling at the same time, the inter-stage gain amplifier G is reset, and the switches clk6, clk8, clk5, clk7 are OFF.

In the fifth stage (an amplification stage), the switches clk2, clk3 are ON, the switches clk1, clk4 are OFF, the stage-1 sub-ADC ADC1 and the sampling capacitor Cs2 complete signal holding at the same time, the stage-1 sub-ADC ADC1 performs quantization during the signal holding, the switches clk5, clk8 are ON, the switches clk6, clk7 are OFF, and the residual is amplified by the inter-stage gain amplifier G and is sampled to the stage-2 sub-ADC ADC21 to be quantized.

In the sixth stage (a hold stage), the switch clk3 is ON, the switches clk1, clk2, clk4 are OFF, the stage-1 sub-ADC ADC1 completes the quantization and is disconnected from the sampling capacitor Cs2, the residual of the stage-1 sub-ADC ADC1 is held on the sampling capacitor Cs2, the switches clk5, clk8 are ON, the switches clk6, clk7 are OFF, and the residual is still amplified by the inter-stage gain amplifier G and is sampled to the stage-2 sub-ADC ADC21 to be quantized.

In this way, the six stages are repeated periodically to realize the periodical staggering of the sampling phase and the amplification phase of the inter-stage gain amplifier and interleaving multiplexing of the stage-2 sub-ADCs. As can be understood, since the six stages are repeated periodically, any one of the stages can be used as a start stage. For example, it is also feasible to take the second stage, the third stage, the fourth stage, the fifth stage, the sixth stage, and the first stage which are carried out in sequence as one cyclic unit.

Example Three

In this example, the ADC has N analog-to-digital conversion channels.

When phase staggering and time interweaving of the N analog-to-digital conversion channels are carried out: in the first clock cycle, residual of the first analog-to-digital conversion channel is amplified, and at the same time, sampling and quantization of the second analog-to-digital conversion channel are carried out: in the second clock cycle, residual of the second analog-to-digital conversion channel is amplified, and at the same time, sampling and quantization of the third analog-to-digital conversion channel are carried out: in the $(N-1)^{th}$ clock cycle, residual of the $(N-1)^{th}$ analog-to-digital conversion channel is amplified, and at the same time, sampling and quantization of the $N^{th}$ analog-to-digital conversion channel are carried out; and the cycles are repeated.

Example Four

In this example, the ADC has N analog-to-digital conversion channels.

When phase staggering and time interweaving of the N analog-to-digital conversion channels are carried out: in the first clock cycle, residual of the first channel is amplified, and at the same time, sampling and quantization of the $(l+1)^{th}$ channel are carried out: in the second clock cycle, residual of the second channel is amplified, and at the same time, sampling and quantization of the $(l+2)^{th}$ channel are carried out: in the $(N-1)^{th}$ clock cycle, residual of the $(N-1)^{th}$ channel is amplified, and at the same time, sampling and quantization of the $(l-1)^{th}$ channel are carried out; and the cycles are repeated.

It should be understood by those of ordinary skill in the art that the functional modules/units in all or some of the operations, the systems, and the devices in the method disclosed above may be implemented as software, firmware, hardware, or suitable combinations thereof. If implemented as hardware, the division between the functional modules/units stated above is not necessarily corresponding to the division of physical components: for example, one physical component may have a plurality of functions, or one function or operation may be performed through cooperation of several physical components. Some or all of the physical components may be implemented as software executed by a processor, such as a central processing unit, a digital signal processor or a microprocessor, or may be implemented as hardware, or may be implemented as an integrated circuit, such as an application specific integrated circuit. Such software may be distributed on a computer-readable medium, which may include a computer storage medium (or a non-transitory medium) and a communication medium (or a transitory medium). As well known by those of ordinary skill in the art, the term "computer storage medium" includes volatile/nonvolatile and removable/non-removable media used in any method or technology for storing information (such as computer-readable instructions, data structures, program modules and other data). The computer storage medium includes, but is not limited to, a Random Access Memory (RAM), a Read-Only Memory (ROM), an Electrically Erasable Programmable Read-Only Memory (EEPROM), a flash memory or other memory techniques, a Compact Disc Read Only Memory (CD-ROM), a Digital Versatile Disc (DVD) or other optical discs, a magnetic cassette, a magnetic tape, a magnetic disk or other magnetic storage devices, or any other medium which can be configured to store desired information and can be accessed by a computer. In addition, it is well known by those of ordinary skill in the art that the communication media generally include computer-readable instructions, data structures, program modules, or other data in modulated data signals such as carrier wave or other transmission mechanism, and may include any information delivery medium.

The present disclosure discloses the exemplary implementations using specific terms, but the terms are merely used and should be merely interpreted as having general illustrative meanings, rather than for the purpose of limitation. Unless expressly stated, it is apparent to those of ordinary skill in the art that features, characteristics and/or elements described in connection with a particular implementation can be used alone or in combination with features, characteristics and/or elements described in connection with other implementations. Therefore, it should be understood by those of ordinary skill in the art that various changes in the forms and the details can be made without departing from the scope of the present disclosure of the appended claims.

What is claimed is:

1. An analog-to-digital conversion method applied to an analog-to-digital converter, the analog-to-digital converter comprising a stage-1 sub-analog-to-digital converter, a plurality of sampling capacitors, an inter-stage gain amplifier, and a plurality of stage-2 sub-analog-to-digital converters; wherein the analog-to-digital converter comprises a plurality of analog-to-digital conversion channels each corresponding to one of the sampling capacitors and one of the stage-2 sub-analog-to-digital converters; the analog-to-digital conversion method comprises a plurality of clock cycles; for any of the clock cycles, the plurality of analog-to-digital conversion channels comprises an analog-to-digital conversion channel serving as a first analog-to-digital conversion channel and an analog-to-digital conversion channel serving as a second analog-to-digital conversion channel, and the analog-to-digital conversion method comprises:

amplifying, through the inter-stage gain amplifier, a first residual stored in a sampling capacitor corresponding to the first analog-to-digital conversion channel, and sampling the amplified first residual through a stage-2 sub-analog-to-digital converter corresponding to the first analog-to-digital conversion channel;

sampling and quantizing an analog signal through the stage-1 sub-analog-to-digital converter, and storing an obtained second residual in a sampling capacitor corresponding to the second analog-to-digital conversion channel; and generating a digital signal according to an output signal of the stage-1 sub-analog-to-digital converter and output signals of the plurality of stage-2 sub-analog-to-digital converters;

wherein, for any two adjacent clock cycles, the analog-to-digital conversion channel serving as the second analog-to-digital conversion channel in a current clock cycle serves as the first analog-to-digital conversion channel in a next clock cycle.

2. The analog-to-digital conversion method of claim 1, wherein the analog-to-digital converter further comprises a comparator; and for any of the clock cycles, the plurality of analog-to-digital conversion channels further comprise an analog-to-digital conversion channel serving as a third analog-to-digital conversion channel, and the analog-to-digital conversion method further comprises:

performing quantization through a stage-2 sub-analog-to-digital converter corresponding to the third analog-to-digital conversion channel to obtain a quantized signal; and generating, through the comparator according to the quantized signal, an output signal of the stage-2 sub-analog-to-digital converter corresponding to the third analog-to-digital conversion channel;

wherein the analog-to-digital conversion channel serving as the third analog-to-digital conversion channel serves as the first analog-to-digital conversion channel in a first clock cycle before the current clock cycle.

3. The analog-to-digital conversion method of claim 1, wherein the analog-to-digital converter further comprises a selector; and for any of the clock cycles, the plurality of analog-to-digital conversion channels further comprise an analog-to-digital conversion channel serving as a fourth analog-to-digital conversion channel, and the analog-to-digital conversion method further comprises:

outputting, through the selector, an output signal of a stage-2 sub-analog-to-digital converter corresponding to the fourth analog-to-digital conversion channel to an encoder;

wherein the analog-to-digital conversion channel serving as the fourth analog-to-digital conversion channel serves as the first analog-to-digital conversion channel in a second clock cycle before the current clock cycle.

4. The analog-to-digital conversion method of claim 3, wherein generating the digital signal according to the output signal of the stage-1 sub-analog-to-digital converter and the output signals of the plurality of stage-2 sub-analog-to-digital converters comprises:

generating the digital signal through the encoder according to the output signal of the stage-1 sub-analog-to-digital converter and the output signal of the stage-2 sub-analog-to-digital converter corresponding to the fourth analog-to-digital conversion channel.

5. The analog-to-digital conversion method of claim 1, wherein a number of the plurality of analog-to-digital conversion channels is N; and for any of the clock cycles, an $n^{th}$ analog-to-digital conversion channel serves as the first analog-to-digital conversion channel, and an $m^{th}$ analog-to-digital conversion channel serves as the second analog-to-digital conversion channel;

wherein, $$m = \begin{cases} (n+l) \bmod N, & n+l \neq N \\ N, & n+l = N \end{cases}$$

wherein mod represents a remainder operation, and N, l, n, and m are integers, where $N>1$, $1 \leq n \leq N$, $1 \leq m \leq N$, and $1 \leq l < N$.

6. An analog-to-digital converter, comprising a stage-1 sub-analog-to-digital converter, a plurality of sampling capacitors, an inter-stage gain amplifier, and a plurality of stage-2 sub-analog-to-digital converters; wherein the analog-to-digital converter comprises a plurality of analog-to-digital conversion channels each corresponding to one of the sampling capacitors and one of the stage-2 sub-analog-to-digital converters; the analog-to-digital converter comprises a plurality of clock cycles; and for any of the clock cycles, the analog-to-digital conversion channels comprise an analog-to-digital conversion channel serving as a first analog-to-digital conversion channel and an analog-to-digital conversion channel serving as a second analog-to-digital conversion channel;

the inter-stage gain amplifier is configured to amplify a first residual stored in a sampling capacitor corresponding to the first analog-to-digital conversion channel, and a stage-2 sub-analog-to-digital converter corresponding to the first analog-to-digital conversion channel is configured to sample the amplified first residual;

the stage-1 sub-analog-to-digital converter is configured to sample and quantize an analog signal, and store an obtained second residual in a sampling capacitor corresponding to the second analog-to-digital conversion channel;

the analog-to-digital converter further comprises an encoder configured to generate a digital signal according to an output signal of the stage-1 sub-analog-to-digital converter and output signals of the plurality of stage-2 sub-analog-to-digital converters;

wherein, for any two adjacent clock cycles, the analog-to-digital conversion channel serving as the second analog-to-digital conversion channel in the current clock cycle serves as the first analog-to-digital conversion channel in the next clock cycle.

7. The analog-to-digital converter of claim 6, wherein, for any analog-to-digital conversion channel, the analog-to-digital conversion channel comprises a stage-1 switch, a stage-2 switch, and a stage-3 switch, the stage-1 sub-analog-to-digital converter is connected to a sampling capacitor corresponding to the analog-to-digital conversion channel through the stage-1 switch, and the inter-stage gain amplifier is connected to the sampling capacitor corresponding to the analog-to-digital conversion channel through the stage-2 switch, and is connected to a stage-2 sub-analog-to-digital converter corresponding to the analog-to-digital conversion channel through the stage-3 switch; and for any of the clock cycles:
the stage-1 switch of the first analog-to-digital conversion channel is OFF, the stage-2 switch and the stage-3 switch of the first analog-to-digital conversion channel are ON, the inter-stage gain amplifier amplifies the first residual, and the amplified first residual is sampled through the stage-2 sub-analog-to-digital converter corresponding to the first analog-to-digital conversion channel; and
the stage-1 switch of the second analog-to-digital conversion channel is ON, the stage-2 switch and the stage-3 switch of the second analog-to-digital conversion channel are OFF, the stage-1 sub-analog-to-digital converter samples and quantizes the analog signal, and stores the obtained second residual in the sampling capacitor corresponding to the second analog-to-digital conversion channel.

8. The analog-to-digital converter of claim 7, any of the clock cycles comprises a reset stage, an amplification stage, and a hold stage in sequence;
in the reset stage, the stage-1 switch and the stage-2 switch of the first analog-to-digital conversion channel are OFF, and the inter-stage gain amplifier is reset; and the stage-1 switch of the second analog-to-digital conversion channel is ON, the stage-2 switch of the second analog-to-digital conversion channel is OFF, and the stage-1 sub-analog-to-digital converter samples and quantizes the analog signal;
in the amplification stage, the stage-1 switch of the first analog-to-digital conversion channel is OFF, the stage-2 switch of the first analog-to-digital conversion channel is ON, and the inter-stage gain amplifier amplifies the first residual; and the stage-1 switch of the second analog-to-digital conversion channel is ON, the stage-2 switch of the second analog-to-digital conversion channel is OFF, and the stage-1 sub-analog-to-digital converter samples and quantizes the analog signal; and
in the hold stage, the stage-1 switch of the first analog-to-digital conversion channel is OFF, the stage-2 switch of the first analog-to-digital conversion channel is ON, and the inter-stage gain amplifier amplifies the first residual; and the stage-1 switch and the stage-2 switch of the second analog-to-digital conversion channel are OFF, and the second residual is held in the sampling capacitor corresponding to the second analog-to-digital conversion channel.

9. The analog-to-digital converter of claim 6, wherein the analog-to-digital converter further comprises a comparator;

for any of the clock cycles, the plurality of analog-to-digital conversion channels further comprise an analog-to-digital conversion channel serving as a third analog-to-digital conversion channel; for any of the clock cycles:
a stage-2 sub-analog-to-digital converter corresponding to the third analog-to-digital conversion channel performs quantization to obtain a quantized signal;
the comparator is configured to generate an output signal of the stage-2 sub-analog-to-digital converter corresponding to the third analog-to-digital conversion channel according to the quantized signal;
wherein the analog-to-digital conversion channel serving as the third analog-to-digital conversion channel serves as a first analog-to-digital conversion channel in the first clock cycle before the current clock cycle.

10. The analog-to-digital converter of claim 9, wherein, for any analog-to-digital conversion channel, the analog-to-digital conversion channel comprises a stage-4 switch, and a stage-2 sub-analog-to-digital converter corresponding to the analog-to-digital conversion channel is connected to the comparator through the stage-4 switch; and for any of the clock cycles:
the stage-4 switch of the third analog-to-digital conversion channel is ON, so as to enable the stage-2 sub-analog-to-digital converter corresponding to the third analog-to-digital conversion channel to perform quantization to obtain the quantized signal and enable the comparator to generate the output signal of the stage-2 sub-analog-to-digital converter corresponding to the third analog-to-digital conversion channel according to the quantized signal.

11. The analog-to-digital converter of claim 6, wherein the analog-to-digital converter further comprises a selector;
for any of the clock cycles, the plurality of analog-to-digital conversion channels further comprise an analog-to-digital conversion channel serving as a fourth analog-to-digital conversion channel; and for any of the clock cycles:
the selector is configured to output an output signal of a stage-2 sub-analog-to-digital converter corresponding to the fourth analog-to-digital conversion channel to an encoder;
wherein the analog-to-digital conversion channel serving as the fourth analog-to-digital conversion channel serves as the first analog-to-digital conversion channel in the second clock cycle before the current clock cycle.

12. The analog-to-digital converter of claim 11, wherein the selector comprises a plurality of stage-5 switches in one-to-one correspondence with the plurality of analog-to-digital conversion channels; for any analog-to-digital conversion channel, a stage-2 sub-analog-to-digital converter corresponding to the analog-to-digital conversion channel is connected to the encoder through a corresponding stage-5 switch; and for any of the clock cycles:
the stage-5 switch corresponding to the fourth analog-to-digital conversion channel is ON, so as to output an output signal of a stage-2 sub-analog-to-digital converter corresponding to the fourth analog-to-digital conversion channel is output to the encoder.

13. The analog-to-digital converter of claim 11, wherein the encoder is configured to generate the digital signal according to the output signal of the stage-1 sub-analog-to-digital converter and the output signal of the stage-2 sub-analog-to-digital converter corresponding to the fourth analog-to-digital conversion channel.

14. The analog-to-digital converter of claim 6, wherein a number of the plurality of analog-to-digital conversion channels is N; and for any of the clock cycles, an $n^{th}$ analog-to-digital conversion channel serves as the first analog-to-digital conversion channel, and an $m^{th}$ analog-to-digital conversion channel serves as the second analog-to-digital conversion channel;

wherein $$m = \begin{cases} (n+l) \bmod N, & n+l \neq N \\ N, & n+l = N \end{cases}$$

where mod represents a remainder operation, and N, l, n, and m are integers and satisfy N>1, 1≤n≤N, 1≤m≤N, and 1≤l<N.

15. The analog-to-digital converter of claim 6, wherein the analog-to-digital converter further comprises an input buffer configured to cache the analog signal.

16. A base station, comprising the analog-to-digital converter of claim 6.

17. An analog-to-digital converter, comprising:
a stage-1 sub-analog-to-digital converter;
an inter-stage gain amplifier;
a stage-2 sub-analog-to-digital converter;
an encoder configured to generate a digital signal according to an output signal of the stage-1 sub-analog-to-digital converter and an output signal of the stage-2 sub-analog-to-digital converter;
a first analog-to-digital conversion channel comprising a first stage-1 switch, a first stage-2 switch, and a first sampling capacitor, with the stage-1 sub-analog-to-digital converter connected to the first sampling capacitor through the first stage-1 switch, and the inter-stage gain amplifier connected to the first sampling capacitor through the first stage-2 switch; and
a second analog-to-digital conversion channel comprising a second stage-1 switch, a second stage-2 switch, and a second sampling capacitor, with the stage-1 sub-analog-to-digital converter connected to the second sampling capacitor through the second stage-1 switch, and the inter-stage gain amplifier connected to the second sampling capacitor through the second stage-2 switch-folk,
wherein the analog-to-digital converter is configured to perform an analog-to-digital conversion process that comprises a plurality of cyclic units repeated periodically, and each of the cyclic units comprises the following six stages in sequence:
a first reset stage, in which the first stage-1 switch-folk is ON, and the second stage-1 switch, the first stage-2 switch, and the second stage-2 switch are OFF;
a first amplification stage, in which the first stage-1 switch and the second stage-2 switch are ON, and the second stage-1 switch and the first stage-2 switch are OFF;
a first hold stage, in which the second stage-2 switch is ON, and the second stage-1 switch, the first stage-2 switch, and the first stage-1 switch are OFF;
a second reset stage, in which the second stage-1 switch is ON, and the first stage-1 switch, the first stage-2 switch, and the second stage-2 switch are OFF;
a second amplification stage, in which the second stage-1 switch and the first stage-2 switch are ON, and the first stage-1 switch and the second stage-2 switch are OFF; and
a second hold stage, in which the first stage-2 switch is ON, and the first stage-1 switch, the second stage-1 switch, and the second stage-2 switch are OFF,
wherein
when the first stage-1 switch is ON, the stage-1 sub-analog-to-digital converter samples and quantizes an analog signal, and the first sampling capacitor samples a residual generated by quantization of the stage-1 sub-analog-to-digital converter;
when the second stage-1 switch is ON, the stage-1 sub-analog-to-digital converter samples and quantizes the analog signal, and the second sampling capacitor samples a residual generated by quantization of the stage-1 sub-analog-to-digital converter;
when the first stage-2 switch is ON, the inter-stage gain amplifier amplifies a residual held by the first sampling capacitor, and the stage-2 sub-analog-to-digital converter samples and quantizes the residual amplified by the inter-stage gain amplifier;
when the second stage-2 switch is ON, the inter-stage gain amplifier amplifies a residual held by the second sampling capacitor, and the stage-2 sub-analog-to-digital converter samples and quantizes the residual amplified by the inter-stage gain amplifier; and
when the first stage-2 switch and the second stage-2 switch are both OFF, the inter-stage gain amplifier is reset.

* * * * *